United States Patent
Noraev

(10) Patent No.: US 7,270,866 B2
(45) Date of Patent: Sep. 18, 2007

(54) PIRACY-RESISTANT DATA LEASING SYSTEM AND METHOD

(76) Inventor: Dmitry A Noraev, 31 Rolling Hill Dr., Chatham, NJ (US) 07928

( * ) Notice: Subject to any disclaimer, the term of this patent is extended or adjusted under 35 U.S.C. 154(b) by 257 days.

(21) Appl. No.: 10/707,819

(22) Filed: Jan. 14, 2004

(65) Prior Publication Data

US 2005/0069670 A1    Mar. 31, 2005

Related U.S. Application Data

(60) Provisional application No. 60/481,450, filed on Sep. 30, 2003.

(51) Int. Cl.
*B32B 3/02* (2006.01)
(52) U.S. Cl. ............. 428/64.4; 369/47.55; 430/270.11; 705/57
(58) Field of Classification Search ...................... None
See application file for complete search history.

(56) References Cited

U.S. PATENT DOCUMENTS

| | | | |
|---|---|---|---|
| 5,513,169 A | 4/1996 | Fite et al. | 369/272 |
| 5,815,484 A | 9/1998 | Smith et al. | 369/275.1 |
| 6,011,772 A | 1/2000 | Rollhaus et al. | 369/286 |
| 6,025,868 A | 2/2000 | Russo | 348/3 |
| 6,228,440 B1 | 5/2001 | Dailey et al. | 428/1.1 |
| 6,338,933 B1 | 1/2002 | Lawandy et al. | 430/270.1 |
| 6,343,063 B1 | 1/2002 | Rollhaus et al. | 369/286 |
| 6,381,747 B1 | 4/2002 | Wonfor et al. | 725/104 |
| 6,434,109 B2 | 8/2002 | Rollhaus et al. | 369/286 |
| 6,468,619 B1 | 10/2002 | Larroche | 428/64.1 |
| 6,477,134 B1 | 11/2002 | Stebbings et al. | 369/272 |
| 6,511,728 B1 | 1/2003 | Bakos et al. | 428/64.1 |
| 6,531,262 B1 | 3/2003 | Lawandy et al. | 430/270.15 |
| 6,537,635 B1 | 3/2003 | Bakos et al. | 428/64.1 |
| 6,589,626 B2 | 7/2003 | Selinfreund et al. | 428/64.1 |

*Primary Examiner*—Bruce H. Hess
(74) *Attorney, Agent, or Firm*—Fish & Richardson P.C.

(57) ABSTRACT

The present invention discloses the data storage medium enabling subsequent alteration by a user or user's data rendering system in order to enforce the restrictive covenants of the data usage agreement. The present invention also discloses the data rendering system designed to work with said data storage medium. The present invention also discloses the piracy-resistant method to deliver data stored on a removable data storage medium.

42 Claims, 8 Drawing Sheets

PIRACY-RESISTANT DATA LEASING SYSTEM AND METHOD

CROSS REFERENCE TO RELATED APPLICATIONS

This application claims the benefit of U.S. Provisional Application Ser. No. 60/481,450, filed Sep. 30, 2003. The disclosure of this Provisional Patent Application is incorporated by reference herein in its entirety.

BACKGROUND OF INVENTION

Ever since the concept of paid-for data access has been first implemented, content providers have had to work a delicate balance between inconveniencing legitimate users by excessive access constraints and implementing a sufficient number of protective techniques to stop or at least to slow down the ever more creative data pirates.

For example, one of the major inconveniences of a traditional video rental model is the necessity to return a rented video or a videogame to the rental outlet on time. By demanding a timely return of the rentals, the content providers ensure that the duration of the rental period is properly enforced (creating a major hassle for their customers in the process). To mitigate the inconvenience resulting from the necessity to return rented tapes and DVDs, a rent-by-mail service is currently offered by Netflix Inc. and WalMart Inc., where a client pays a monthly fee for the right to hold several video DVDs. When some of the DVDs are mailed back to a warehouse, new rentals can be ordered. GameFly Inc. and GamesForRent Inc. offer similar rent-by-mail service for videogames. Even though the rent-by-mail model has advantages over the traditional rental model, it still requires customers to return rented material, increasing the overall costs and creating the blackout periods during DVDs shipping time.

While shipping costs have been steadily growing over the years, the prices of digital storage media, such as DVD-R disks, have been falling. Eventually it will be more economical to discard the data storage medium after the expiration of the data rental period than to return the used data storage medium to the data provider. There is, however, a necessity to come up with a method and a system which would allow data providers to enforce the terms of the rental agreements without reclaiming the rented data storage media. A well researched way of data distribution involves a dedicated set-top box which electronically receives encoded data from a central location, stores a large read-only library of data, or reads data from freely distributed data media, such as CDs or DVDs. When a subscriber selects a data file for usage, the set-top box contacts the central computer to request the decoding key or to process a billing request. In order to mass-customize the production of optical disks, a unique code may be formed on an optical disk mass-molded from a master substrate by removing the reflective coating from selected portions of the information recording area to form a code pattern. The sophistication of the processing set-top device and the general complexity of this method render it practically unusable.

One way to slow down the piracy, discussed in a number of US patents, is to encode data on perishable media. A typical perishable medium would have a reactive compound which changes from an optically transparent state to an optically opaque state when subjected to readout light and/or atmospheric oxygen, or decays after a certain pre-determined time interval. In the alternative embodiment, an unstable compound temporarily flattens the textured surface and enables the optical readout of the data. With time the optical transmission through the surface is reduced, as the unstable compound is gradually removed via sublimation and the texture of the surface is revealed. In another variation, a light-changeable compound is incorporated into a section of an optical medium. The compound temporarily distorts the digital data output from a section of the recording layer. As most optical media players are pre-programmed to re-sample data areas of the recording layer to assure correct copying, the varying output from the disclosed optical medium prevents copying. The more exotic alternative includes a breakable reservoir with chemical agent that interacts with the data storage portion to render it unreadable after a specified period of time. The concept of perishable data medium, while attractive in principle, suffers from several drawbacks. In many cases the manufacturing process has to take place in the oxygen-free atmosphere, increasing costs. The timing of the decay may vary depending on the surrounding conditions. For example, while the medium may be designed to decay within a certain number of days at room temperature, it may decay much slower at lower temperatures. A street smart user could simply keep his movie library in a freezer, circumventing the intended data usage agreement. Alternatively, the media designed to decay in laboratory conditions from exposure to oxygen may stay virtually decay free if intentionally covered with a microscopic layer of machine oil which would prevent atmospheric oxygen from reaching its intended target.

With the advances in home computer technology, an average consumer having an average PC will soon be able to make an exact replica of a rented or purchased DVD, containing a video, videogame or any other video content. As such technology becomes widely available, the current video distribution model no longer protects the content providers from data piracy. A similar problem is already evident in the case of the music industry: an audio CD can no longer be safely rented (or even sold), since it offers virtually no protection against illegal copying. In a remarkable show of desperation, the Recording Industry Association of America disclosed a method and system of marking data media products by introducing a tracing substance into a polycarbonate or polystyrene composition during the manufacturing stages of CDs or DVDs a technique commonly reserved for tracking explosives by Government anti-terrorist agencies. Therefore, there is a pressing need for new ways to enforce the copyright protection of data.

SUMMARY OF INVENTION

It is an object of the present invention to provide a new data storage medium (DSM) which is particularly constructed for subsequent alteration by a data user or user's data rendering system (DRS) to help enforce the restrictive covenants of the data usage agreement.

A further object of the present invention is to provide a new DSM which is relatively easy to manufacture without substantial increases in costs.

Another object of the present invention is to provide a DRS designed to work with the DSM enabled for subsequent alteration.

Another object of the present invention is to provide a method by which the terms of the data usage agreement can be enforced without the necessity to return the DSM to a content provider.

Yet another object of the present invention is to provide a method for data distribution which allows for flexibility in choosing the restrictive covenants of the data usage agreement.

In the preferred embodiment of the present invention, the vital access data is recorded on the part of the DSM targeted for subsequent alteration by a user or user's DRS. The DSM containing the data is then placed into the dedicated DRS comprising a data reader, an alteration detector, a memory cell, and a logic unit. After the access information from the part of the DSM subject to subsequent alteration is recorded into the system's memory cell, the DSM is altered either mechanically, via adding, removing or shifting the material, or in any other way detectable by the DRS. The alteration can be executed by the DRS itself, or alternatively it can be executed manually, by the data user. The irreversible alteration of the DSM corrupts the access data and renders the DSM unusable by any DRS, other than the one which already contains the access information in its memory cell. Having confirmed that the alteration is complete, the logic unit of the DRS grants the user access to the main data on the terms prescribed by the data usage agreement. If the usage agreement expires, the access data is deleted from the memory cell of the DRS rendering the altered DSM inaccessible.

These and other objects of the present invention will become more readily appreciated and understood from a consideration of the following detailed description of the exemplary embodiments of the present invention when taken together with the accompanying drawings.

DETAILED DESCRIPTION

Figure 1A:
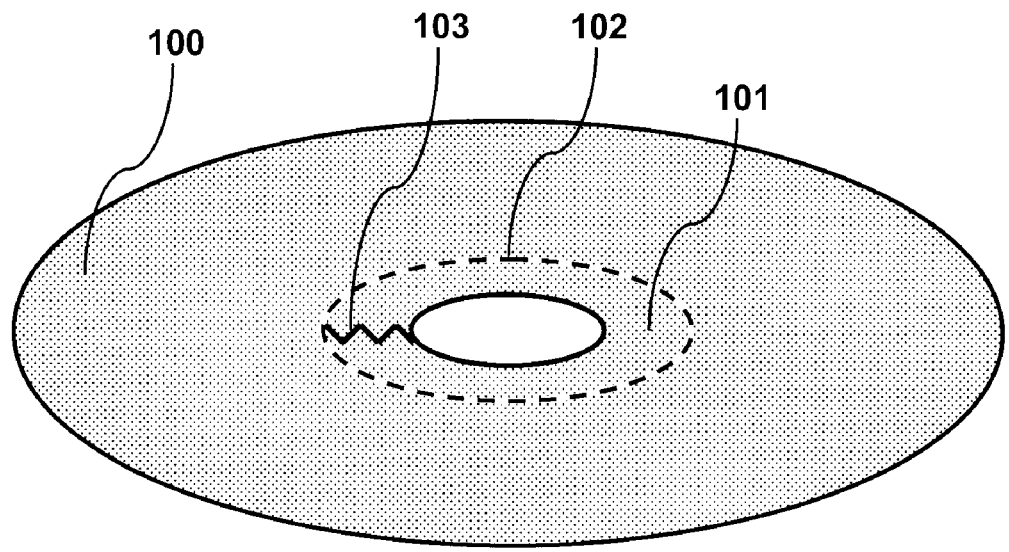
FIGS. 1a and 1b depict the example of the data storage medium (DSM) enabling subsequent mechanical alteration via the complete detachment of the part of the DSM.

A clear conception of the advantages and features constituting the invention, and of the components and operation of model systems provided with the invention, will become more readily apparent by referring to the exemplary, and therefore non-limiting, embodiments illustrated in the drawings accompanying and forming a part of this specification. Descriptions of well known components and processing techniques are omitted so as to not unnecessarily obscure the invention in detail. It should be further noted that the features illustrated in the drawings are not necessarily drawn to scale. The following abbreviations are used throughout this text: Data Storage Medium (DSM); Data Rendering System (DRS).

Figure 1B:
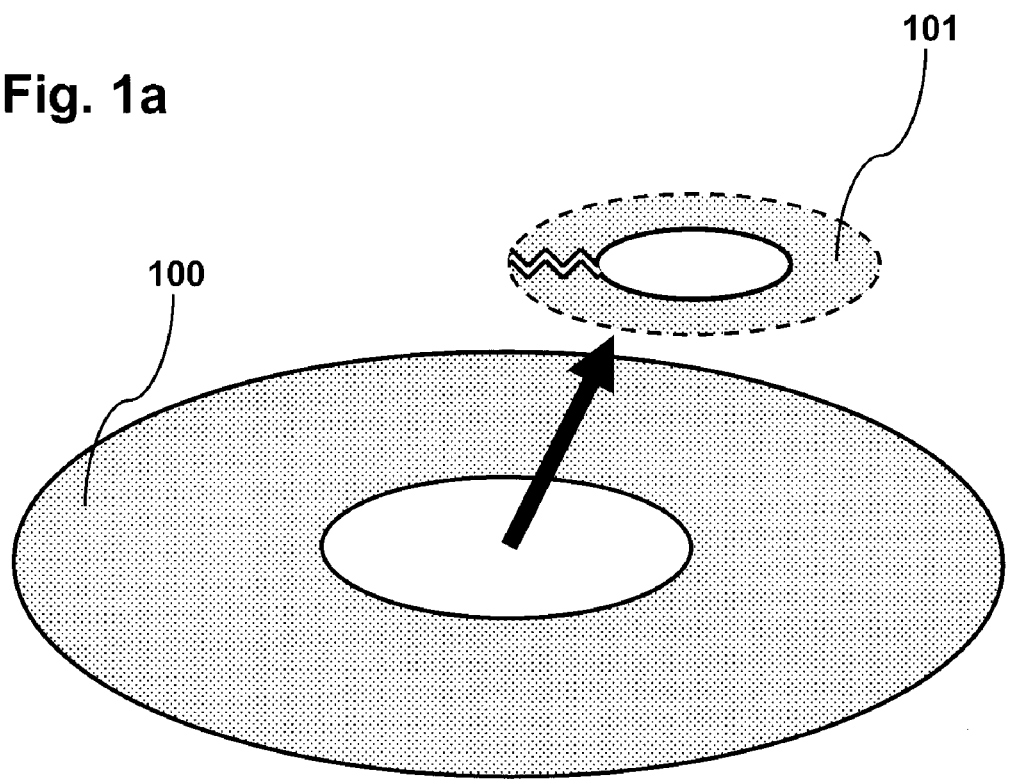

FIGS. 1a and 1b provide the example of the DSM enabling subsequent mechanical alteration by a data user. In this example, the DSM 100 has a circular shape similar to that of a common DVD disk. The DSM 100 may be an optically readable medium or any other storage medium known in the prior art. The data encoded on the DSM 100 may be audio data, video data, video game, computer software, graphical data or any other data. The vital access data is encoded on the inner part 101 of DSM 100. The inner part 101 is bound by the perimeter of structural weakness 102 running along the circumference concentric with the DSM 100. The perimeter of structural weakness 102 essentially an intentional defect, such as a manufactured internal crack in the DSM or a perforation line, enables subsequent alteration of the DSM 100 under the impact of an external mechanical force. The architecture of the sector 101 may optionally include an additional structural weakness 103 making it impossible to separate the part 101 from the DSM 100 without causing the irreparable damage to the detached part 101. Such damage will make the detached part 101 to be unreadable by any DRS. After the vital access data from the sector 101 is recorded into the memory cell of the DRS (not pictured), the user is prompted by the DRS to alter the DSM 100. The inner part 101 of the DSM 100 is then broken off along the line of structural weakness 102 under the mechanical force exercised by a user and discarded. The mechanically altered DSM 100, lacking the vital access information previously recorded on the detached part 101, is no longer accessible by any DRS other than the one containing the missing access information in its memory cell. While FIGS. 1a and 1b depict the DSM 100 similar in shape to a common DVD disk, the scope of the present invention is not limited to any particular geometrical shape of the DSM 100, and/or to any particular geometrical shape of the DSM sector 101 subject to subsequent alteration. For example, instead of altering the inner portion of the DSM 100, the alteration could be performed on its outer part or any arbitrary part of the DSM 100 having any arbitrary shape.

Figure 2A:
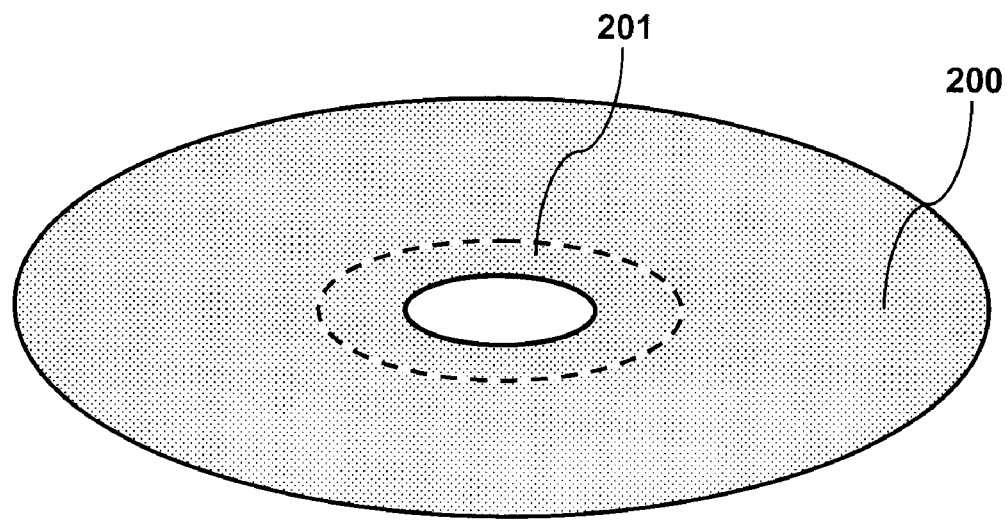
FIGS. 2a and 2b depict the example of the DSM enabling subsequent mechanical alteration via the removal of the surface layer from the part of the DSM.
Figure 2B:
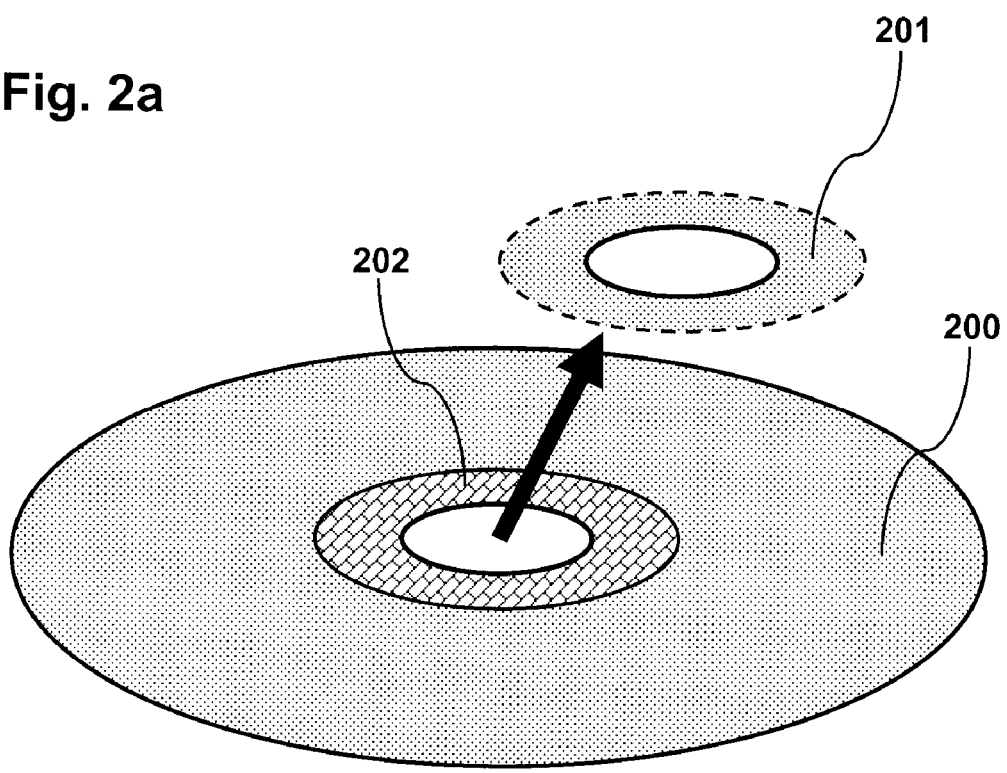

FIGS. 2a and 2b depict another version of the present invention where some of the vital access data is encoded on a detachable layer 201 of the disk-shaped DSM 200. The detachable label 201 has a shape of the ring concentric to the DSM 200. When the mechanical alteration of the DSM 200 is required, the user simply peels off the layer of the material 201 along with some of the access data encoded on it to reveal the underlying substrate 202 which may be blank, may have a specific texture recognizable by the DRS (not pictured), or may in turn contain data. In the case when the DSM is similar to a common CD or DVD disk, the detachable layer 201 can be made of a polymer having a data-containing metallic layer. The substrate 202 can be made of polycarbonate or other materials known to those skilled in the art. Once again, the altered DSM 200 is accessible only by the DRS having the missing access information in its memory cell. The case when the underlying substrate 202 in turn contains data deserves special recognition, since the physical inability of any data reader to access the underlying data until the detachable label 201 is lifted adds an additional degree of protection. The scope of the present invention is not limited to any particular geometrical shape of the DSM 200, or to any particular geometrical shape of the removable layer 201.

Figure 3A:
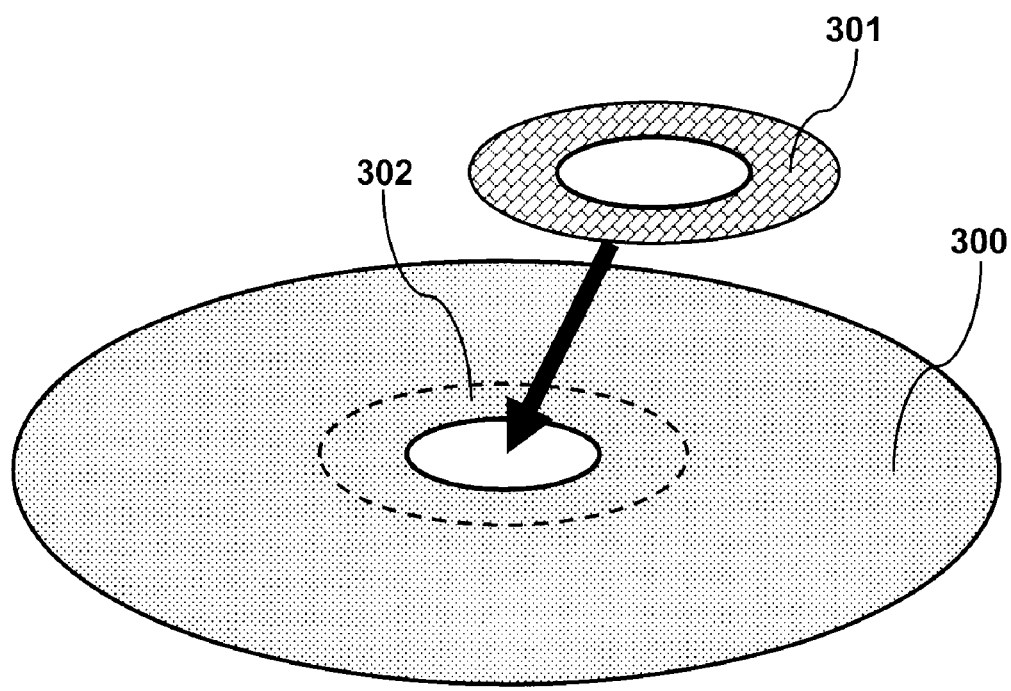
FIGS. 3a and 3b depict the example of the DSM enabling subsequent mechanical alteration by adding a permanent label to a pre-marked area of the DSM.
Figure 3B:
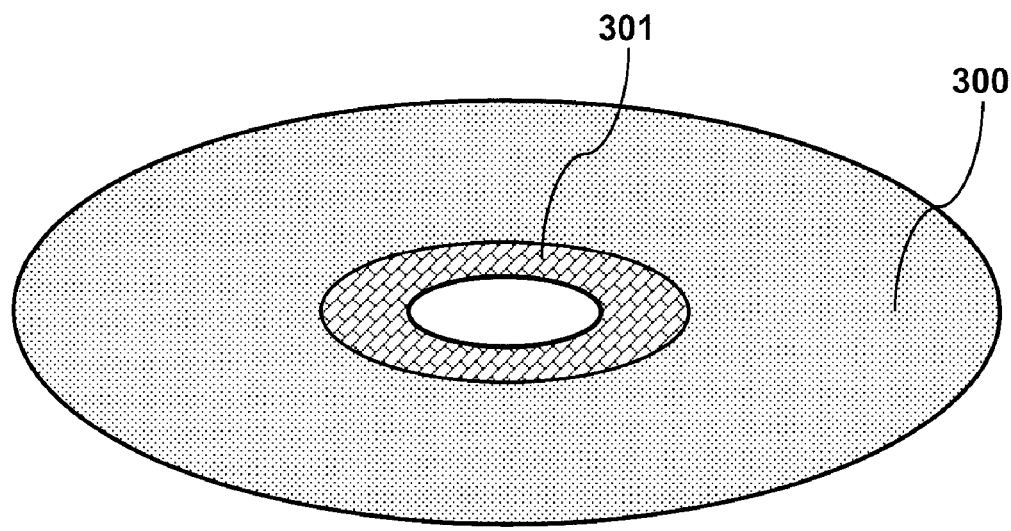

FIGS. 3a and 3b depict yet another version of the present invention, wherein the DSM 300 is mechanically altered by adding the material to it. The label 301 having a particular texture recognizable by the DRS (not pictured) can be permanently affixed to the specified area 302 of the DSM 300, irreversibly blocking some of the data encoded on the DSM 300.

In yet another version of the present invention, the layers of the data storage medium can be irreversibly shifted with respect to each other, permanently changing the layout of the encoded data. The scope of the present invention is not limited to any particular variety of mechanical alteration of the DSM. All the mechanical alterations of the data storage medium via adding, removing or shifting material are covered by the scope of the present invention.

Figure 4:
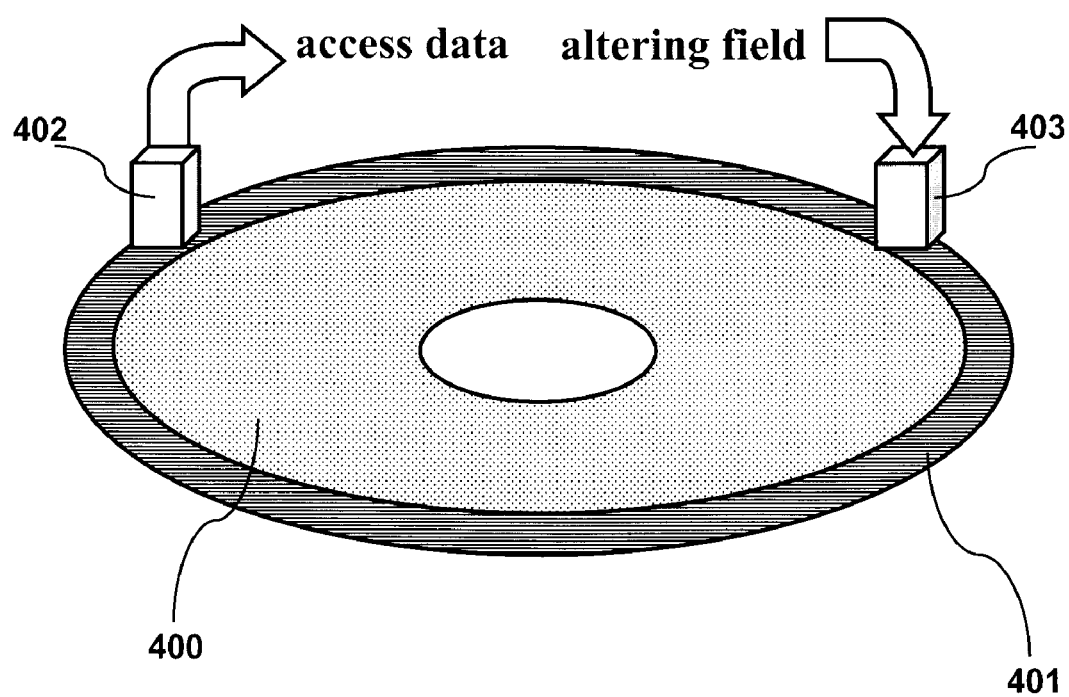
FIG. 4 depicts the example of the DSM enabling subsequent alteration via exposing a data-containing magnetic strip to a magnetic or an electromagnetic field.

Further, the scope of the present invention is not limited to any type of the DSM alteration. Any alteration of the DSM which can be reliably detected and confirmed by the dedicated DRS is covered by the scope of the present invention. For example the DSM may be altered by applying a thermal, magnetic or electromagnetic field, by exposing the DSM to a chemical or exposing it to light, by changing one or more physical properties of at least some of the composing material. FIG. 4 provides an example of the DSM 400 enabling subsequent alteration by a magnetic or an electromagnetic field, wherein a outer ring-shaped sector of the DSM 400 is a magnetic strip 401 containing vital access data. After the access data is retrieved by the magnetic data reader 402, it is erased by exposing the magnetic strip 401 to the magnetic or electromagnetic field supplied through the erasing device 403. Alternatively, the alteration may be conducted manually via exposing the magnetic strip 401 to a strong fixed-pole magnet (not pictured). FIG. 4 depicts the case of the internal alteration by the DRS itself, wherein the magnetic reader 402 and magnetic eraser are two separate devices. In the alternative embodiment the reader 402 and the erasing device 403 may be combined in a single read/right magnetic head. The DRS, having confirmed that the access data on the magnetic strip 401 is permanently erased, grants the user access to the main data encoded on the DSM 400 according to the terms of the data usage agreement. While the scope of the present invention is not limited to any particular type of the main data encoding, in this particular embodiment it is preferable that the encoded main data is not sensitive to the magnetic or electromagnetic field generated to erase the access data on the magnetic strip 401. For example, if the main data is encoded using optical means, it will not be adversely impacted when the erasing magnetic field is applied to the sector 401.

Figure 5:
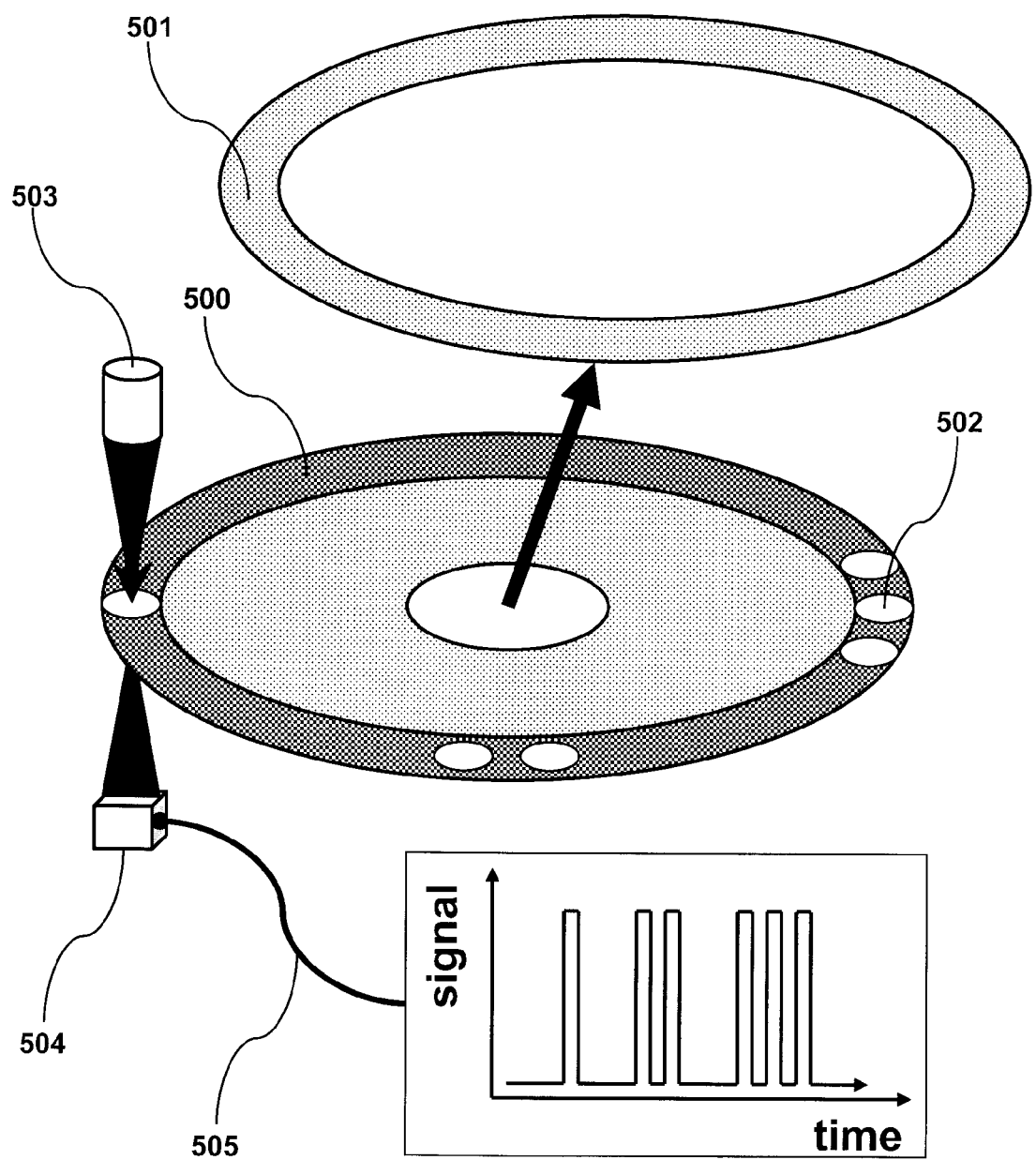
FIG. 5 depicts the example of the optical alteration detector design.

FIG. 5 provides an example of the alteration detection design using optical means. Similar to the process described in the FIGS. 2a and 2b, the alteration of the disk-shaped DSM 500 is performed via peeling off the detachable layer 501 containing vital data. The underlying substrate of the DSM 500 has a sequence of transmitting apertures 502 arranged along the exposed area of the substrate. The light beam emitted by the light source 503 falls on the substrate of the DSM 500. As the DSM 500 rotates around its center, the light beam periodically passes through the apertures 502 onto optical detector 504. The detector 504 registers a time dependent periodic pattern of signals consistent with the pattern of the apertures 502. This time dependent signal is delivered along the line 505 as a confirmation that the alteration of the DSM has been executed. Alternatively, the transmitting apertures 502 may be substituted by a similar set of the reflective spots. In this case the incident light will be periodically reflected to the optical detector located on the same side as the light source with respect to the plane of the DSM 500. If the data storage medium is an optically readable medium, the light source 503 could be a part of an optical data reader.

Figure 6A:
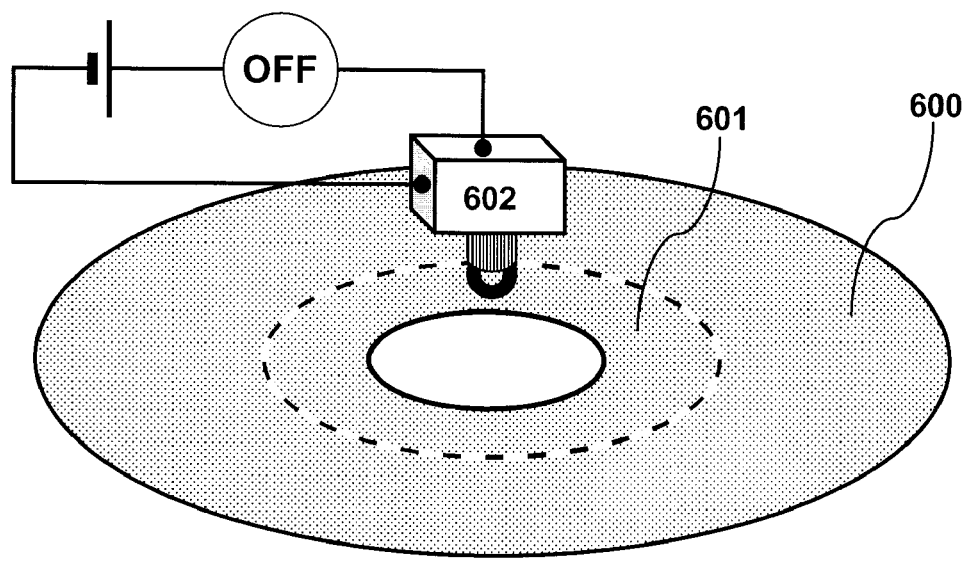
FIG. 6 depicts the example of the electromechanical alteration detector design.
Figure 6B:
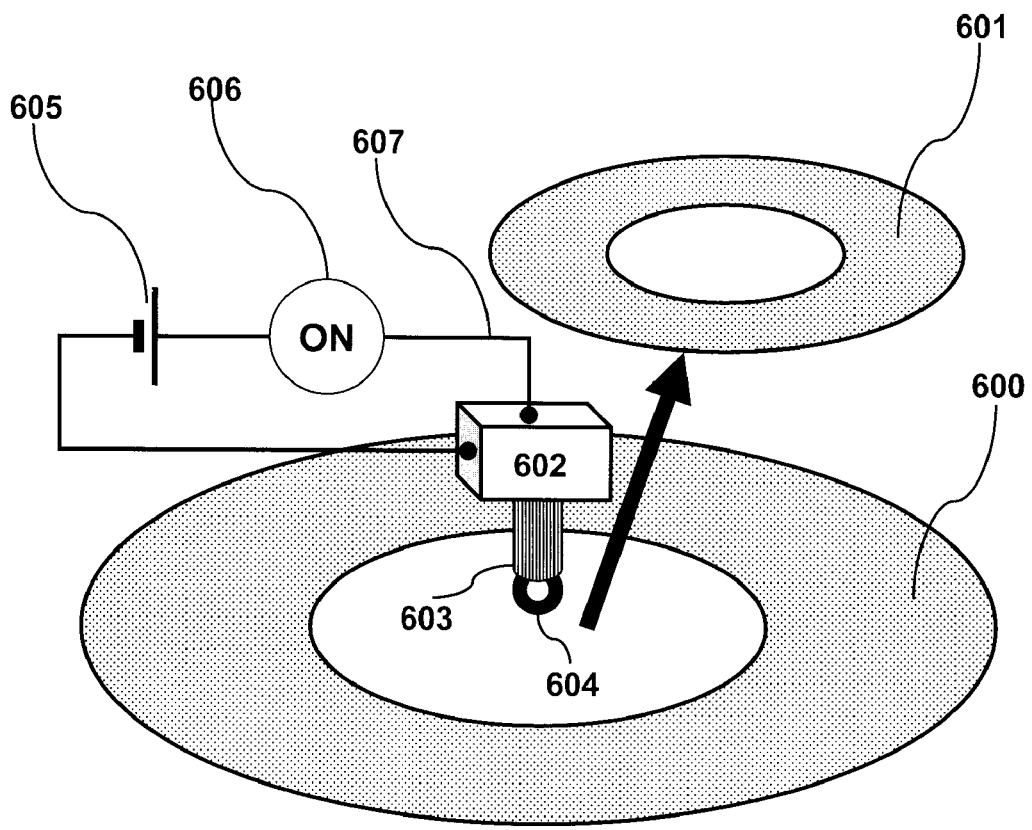

FIGS. 6a and 6b provide another example of the alteration detection mechanism. In this example, the DSM 600 is a disk similar to a common CD or a DVD. The alteration is accomplished by removing the inner part 601 of the disk, similar to the process described on the FIGS. 1a and 1b. A small wheel 604 is situated of the tip of a button 603 of a pushbutton electric switch 602, mounted in the vicinity of the DSM 600. The wheel 604 rolls along the surface of the DSM 600 with a minimal friction. The switch 602 is connected in series to the power supply 605 and the alteration signal generator 606 by the conducting wires 607. When the DSM 600 is not altered (FIG. 6a), the button 603 of the pushbutton switch 602 is pressed against the DSM 600, resulting in the switch 602 being in OFF position. The electric circuit is incomplete and the alteration signal is negative. After the alteration is complete (FIG. 6b), the DSM 600 is no longer pressing on the button 603 of the pushbutton switch 602 and the switch 602 changes to ON position, completing the electric circuit. The circuit returns positive alteration signal. In a more general alternative of the present alteration detection mechanism, a circuit breaker combination 602, 603 and 604 may be substituted by any contact sensitive circuit breaker known in the current art.

In general, the scope of the invention is not limited to any particular design of the alteration detector. The exact composition and the mechanism of the alteration detection is strongly dependent on the alteration type utilized in a particular embodiment and can be easily constructed by a person skilled in the art.

Figure 7:
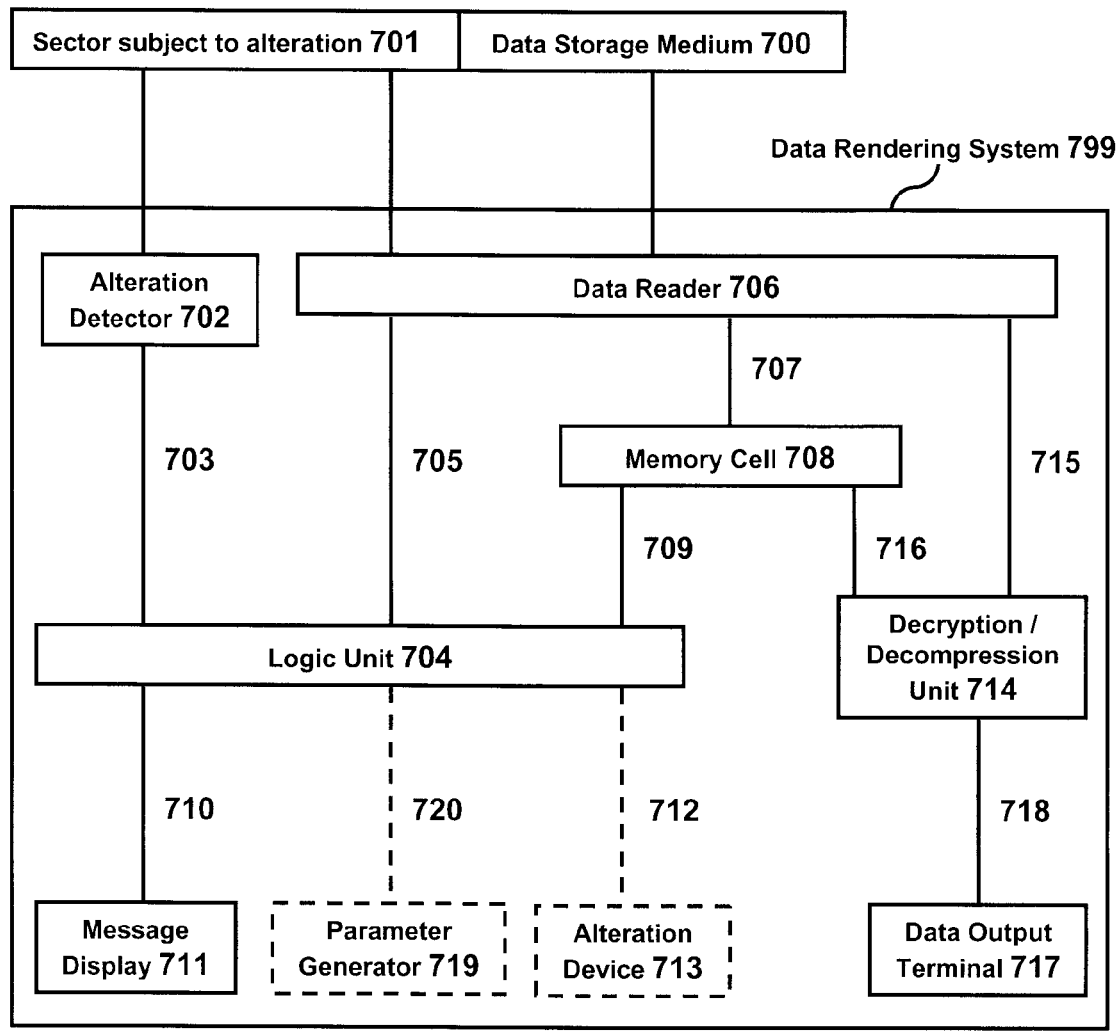
FIG. 7 depicts the rendering system (DRS) designed to work with the DSM enabled for subsequent alteration.

FIG. 7 is a block diagram illustrating the comprehensive embodiment of the DRS 799 designed to work with the DSM enabled for subsequent alteration. In the preferred embodiment, the block 700 represents the DSM wherein some the data access information is encoded on its sector 701 subject to subsequent alteration. The DSM may be selected from a plurality consisting of CDs, DVDs, tapes, laser disks, Zip Disks, Micro Disks, MiniDiscs, flash memory and any other medium known in the current art. The alteration detector 702 of the DRS 799 determines the alteration status of the sector 701 and sends the alteration status signal along the line 703 to the logic unit 704. The specific design of the alteration detector 702 depends on the type of DSM alteration used. While several alteration detector designs are offered in this patent application, other designs may be easily constructed by a reader skilled in the art. The logic unit 704 is preferably a dedicated microchip built into the DRS 799. Alternatively, a separate computer running dedicated software may be plugged into the DRS 799 to serve as a logic unit 704. If the alteration signal from the alteration detector 702 is negative (indicating that the alteration of the DSM 700 has not been done yet), the logic unit 704 sends a command along the line 705 to the data reader 706 to retrieve the access information from the sector 701. The data reader 706 is chosen to match the type of DSM used. The data reader 706 retrieves the information from the sector 701 and sends the retrieved information along the line 707 into the memory cell 708. The memory cell 708 should allow for dynamic access and should be temper-proof. Having received the confirmation along the line 709 that the information from the sector 701 has been stored in the memory cell 708, the logic unit 704 sends the alteration request via the line 710 to the message display 711. The message display 711 may comprise a series of light emitting sources, any other state-changing indicators, or a text or graphics display. The DSM is then ejected by the DRS 799 and the manual alteration of the sector 701 of the DSM 700 is performed by the data user. Optionally, the DRS 799 may be designed to perform the alteration internally. In this case, the alteration request is sent from the logic unit 704 along the line 712 to the alteration device 713. The alteration device 713 then alters the sector 701 of the DSM 700. When the alteration signal from the alteration detector 702 along the line 703 turns positive (indicating that the alteration has been completed), the logic unit 704 sends the command along the line 705 to the data reader 706 to retrieve the main content from the DSM 700 to the decryption/decompression unit 714 along the line 715. Simultaneously, the logic unit 704 sends a command along the line 709 to the memory cell 708 to send the previously recorded access information for this particular DSM 700 along the line 716 to the decryption/decompression unit 714. The decryption/decompression unit 714 may use the data encryption engine based on any commercially available encryption technique known to a user skilled in the art. The data compression may be based upon a standard engine, such as MPEG technology for the case of video data, or it may be based upon a proprietary algorithm to further discourage unauthorized copying. After being decoded and decompressed by the decryption/decompression unit 714, using the access code provided from the memory cell 708, the processed data is sent to the data output terminal 717 along the line 718.

Optionally the data usage agreement may contain further restrictive covenants such as the duration of the authorized data access. In this case an additional step is performed retrieving the time dependent signal from a tamper-proof time-counter 719 along the line 720 to the logic unit 704 and comparing it with the authorized access interval, denying access to the main data unless the complete match occurs. If other restrictive covenants are implemented, the time counter 719 may be replaced or supplemented by a relevant sensor or a measuring apparatus. For example, the data usage agreement could restrict the data access to a particular DRS. In this case the parameter generator 719 may comprise a device generating a signal uniquely identifying the specific DRS. This identification code is then sent to a logic unit 704 for a comparative test against the code written into the DSM access data. In another alternative, the data usage agreement may limit the number of times the data can be accessed. For example, if the main data is a scenario-based video game or a scholar test, the user may be licensed to run the scenario only a specific number of times. In this case, the parameter generator 719 will generate the information about the prior usage history of the particular DSM and update the usage information when the access to this DSM is granted. The examples above illustrate that the present invention offers high degree of flexibility with respect to various possible data usage constraints.

The scope of present invention is not limited by the choice of any particular component functioning in the way prescribed by FIG. 7. Irrespective of any technical variations utilized by a person skilled in the art, the key novel feature of the DRS described in the present invention is that it will not grant the access to the main data unless the access information from the subsequently altered data storage sector exists in the memory cell and the required irreversible alteration of the DSM is detected by the system.

Figure 8:
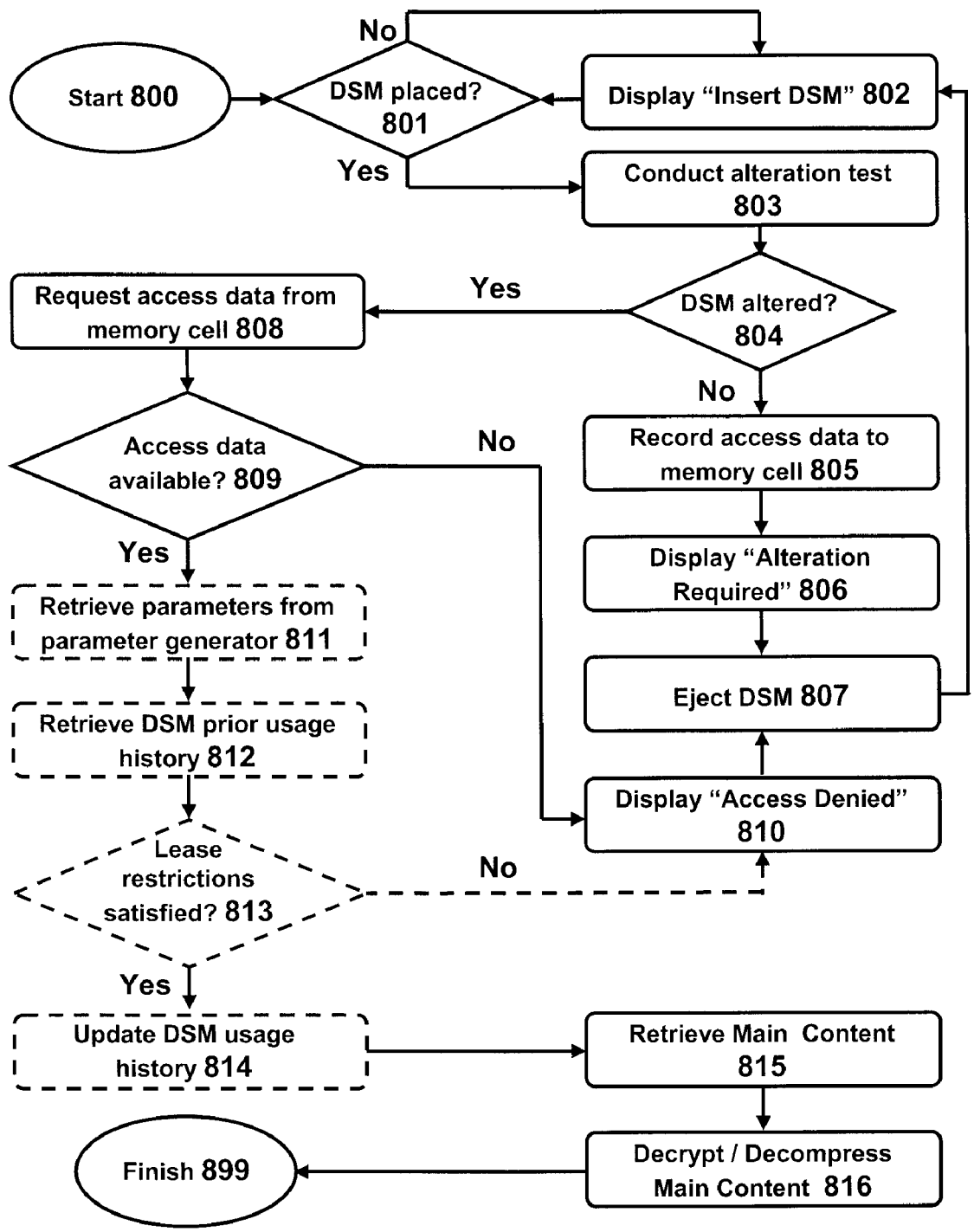
FIG. 8 depicts the top-level logic governing the DRS.

FIG. 8 provides a flow diagram of the top-level logic governing the DRS. Upon the Start 800, the query 801 is made to determine whether the DSM is placed in the DRS. If the DSM is not present in the DRS, the request to place the DSM is generated, step 802. Then the query 801 is repeated. When the DSM is present in the DRS (answer yes to the query 801), the process 803 is performed conducting the alteration test of the DSM and sending the alteration result to the query 804. The query 804 checks whether the DSM has been altered. If DSM alteration has not been detected, (answer no to the query 804), the access information from the sector of the DSM targeted for alteration is recorded into the memory cell, step 805. The access information may contain an encryption key or a password necessary for later data decryption. Then the request to alter the DSM is generated, step 806. The system ejects the DSM via process 807 and prompts for a new DSM to be inserted via step 802. If the DSM has been altered (answer yes to the query 804), the access information is requested from the memory cell of the DRS, step 808. The query 809 checks whether the access information for this particular DSM has been previously recorded into the memory cell of the DRS. If the answer to the query 809 is no, the system displays Access Denied via the process 810, ejects the DSM via the process 807, and displays Insert DSM via the process 802, prompting for a next DSM. If the data usage agreement contains additional restrictive covenants recorded either into the memory cell or on the DSM itself, and if the answer to the query 809 is yes, the information necessary to test the restrictive covenants of the usage agreement is retrieved from the parameter generator, such as temper-proof time counter, via the process 811. Upon the execution of the process 811, the query 813 is executed where the restrictive covenants of the data usage agreement are tested against the parameters retrieved via the process 811. If the restrictive covenants of the lease do not match the parameters retrieved via 811 (answer no to the query 813), the system displays Access Denied via step 810, ejects the DSM via the process 807, and displays Insert DSM via the process 802, prompting for a next DSM. Upon the positive answer to the query 813, the process 815 retrieving the main data file is executed, and the retrieved main content is sent for decryption/decompression using the encryption key previously recovered from the memory cell via step 816. Upon the completion of the decryption/decompression, the End 899 is reached. If the data usage agreement limits the number of times the data can be accessed, the additional steps 812 and 814 are performed, retrieving the prior usage history for a particular DSM before executing the query 813 and updating the usage history when the answer to the query 813 is positive. If there is no limitation on the number of times the data may be accessed, the additional steps 812 and 814 are not present. Similarly, if no lease restrictive covenants are to be checked, the optional step 811 and query 813 are omitted and the positive outcome of query 809 is followed directly by the step 815.

While FIG. 8 describes a case when an alteration-ready DSM is to be used by only one DRS, simple modification of the governing logic can be made for the case of multiple data rendering systems. For example, a user may require an alteration-ready DVD to be recognized by multiple DVD players located in different rooms of his house. In this case, an alteration-ready DSM should be introduced to each DRS (via steps 800 through 807) before being altered. Later, each DRS will be able to recognize the altered DSM since its vital access information is stored in the memory cell of each system.

In the alternative version of the present invention, the access to main content may simply be impossible prior to the DSM alteration because of a specific geometric design. An example of such design was provided in the description of FIG. 2a and FIG. 2b, where some of the content was hidden by a data bearing detachable layer. This alternative configuration supplements functionality of some of the system components and is covered by the scope of the present invention. In another design variation, at least some functionality of the logic unit may be assumed by other DRS components. Such re-assignment of logical functionality is covered by the scope of present invention.

The backward compatibility is an important requirement for any new system and method to be broadly adopted. Therefore, it is preferable for the DRS described above to be compatible not only with the alteration-ready storage media but also with the prior similar storage media, not requiring alteration. For example, the DRS designed to work with alteration-ready DVDs should be made to recognize common DVDs from user's personal video library. In this case, an additional query (not pictured on FIG. 8) may be conducted to determine whether the media is alteration-ready or it is a similar plain-vanilla analog. In the case when the DRS described on FIG. 7 and FIG. 8 recognizes an older unprotected DSM, the data is retrieved directly without any further tests.

On the other side, the recognition of the alteration-ready DSM by other systems, not specifically designed for alteration-ready DSM and not equipped with the temper-proof components, may encourage undesirable data tempering. Therefore, it may be advantageous for alteration-ready DSM to be non-compatible, both before and after alteration, with a DRS designed to work only with plain vanilla analog of an alteration-ready DSM. Such incompatibility may be achieved by subtle differences in media geometry or by using different data encoding standards.

Another important aspect is the legitimate lateral compatibility. A newly acquired alteration-ready DRS preferably should be compatible to the existing library of the alteration-ready DSM. To solve this problem, a temper-proof memory cell of the alteration-ready DRS could be a standalone plug-in module, similar to a memory card. In this case the user can simply take the memory cell module out of his existing alteration-ready DRS and plug it into in a newly purchased alteration-ready DRS. To reduce the potential for abuse introduced by such modular construction of the memory cell, one may implement a proprietary standard for either memory plug configuration or memory encoding, or both.

All the disclosed embodiments of the invention described herein can be realized and practiced without undue experimentation. Although the best modes of carrying out the invention contemplated by the inventor are disclosed above, practice of the invention is not limited thereto. Accordingly, it will be appreciated by those skilled in the art that the invention may be practiced otherwise than as specifically described herein. For example, the individual components need not be formed in the disclosed shapes, or assembled in the disclosed configuration, but could be provided in virtually any shape, and assembled in virtually any configuration. Further, the individual components need not be fabricated from the disclosed materials, but could be fabricated from virtually any suitable materials. Furthermore, all the disclosed elements and features of each disclosed embodiment can be combined with, or substituted for, the disclosed elements and features of every other disclosed embodiment except where such elements or features are mutually exclusive. It will be manifest that various additions, modifications and rearrangements of the features of the invention may be made without deviating from the spirit and scope of the underlying inventive concept. It is intended that the scope of the invention as defined by the appended claims and their equivalents cover all such additions, modifications, and rearrangements.

The invention claimed is:

1. A data storage medium readable by a designated data rendering system, said medium comprising
    a main data storage area configured to store main data and a data usage agreement; and
    a modifiable structure separate from the main storage area configured to be altered in a controlled and verifiable manner by an external influence, wherein the alteration is detectable by said designated data rendering system, and said alteration permanently corrupting at least part of the stored data to enforce at least one restrictive covenant of the data usage agreement, and wherein the stored main data is not accessible by the designated data rendering system until the modifiable structure is altered.

2. The data storage medium according to claim 1 wherein said medium comprises an optically readable medium.

3. The data storage medium according to claim 1 wherein at least part of the stored main data comprises at least one of audio data, video data, video game, computer software, and graphical data.

4. The data storage medium according to claim 1 wherein said modifiable structure comprises at least one structural weakness to assure irreversibility of said alteration.

5. The data storage medium according to claim 1 wherein said external influence comprises a mechanical force.

6. The data storage medium according to claim 1 wherein the data storage medium is composed of one or more materials, and said alteration comprises displacing at least a portion of one of the materials composing said medium.

7. The data storage medium according to claim 1 wherein the modifiable structure is configured to receive additional material to said medium and upon receiving the additional material, the alteration is complete.

8. The data storage medium according to claim 1 wherein access to at least a portion of the stored data is geometrically hindered prior to said alteration.

9. The data storage medium according to claim 1 wherein the data storage medium is composed of one or more materials, and said alteration comprises changing at least one physical property of at least one of the materials composing said medium.

10. The data storage medium according to claim 1 wherein said alteration is conducted by an end user.

11. The data storage medium according to claim 1 wherein said alteration is conducted by the data rendering system.

12. A data rendering system for rendering content delivered on a data storage medium having a main data storage area and a modifiable structure separate from the main storage area enabled for controlled and verifiable alteration by an external influence in a manner detectable by said system, the system comprising:
    a reader that reads data stored in said data storage medium, the stored data including main data and a data usage agreement associated with the main data;
    a memory cell that stores access data designated to be permanently corrupted as a result of said medium alteration;
    an alteration detector that determines whether said data storage medium has been altered, wherein the determined alteration of the data storage medium renders access data previously stored in the data storage medium inaccessible by the system; and a logic unit programmed to deny access to the stored main data upon detecting at least one event out of a plurality of events comprising:

an alteration of said medium has not been confirmed by said alteration detector, access data permanently corrupted as a result of controlled and verifiable medium alteration is not present in said memory cell, and at least one restrictive covenant of said content usage agreement is not satisfied.

13. The data rendering system according to claim 12 further comprising a message display for delivering messages to an end user.

14. The data rendering system according to claim 12, wherein the system is capable of receiving data storage media not requiring alteration but otherwise substantially analogous to the data storage medium requiring controlled and verifiable alteration permanently corrupting at least part of the stored data by an external influence in a manner detectable by said system.

15. The data rendering system according to claim 12 wherein access to at least a portion of the stored data is geometrically hindered prior to the determined controlled alteration of the data storage medium.

16. The data rendering system according to claim 12 wherein at least a portion of said stored data is encrypted, and the stored access data comprises an encryption key essential for decrypting said encrypted data.

17. The data rendering system according to claim 12 wherein said logic unit is further programmed to retrieve at least one restrictive covenant of the data usage agreement from the data storage medium.

18. The data rendering system according to claim 12 wherein said logic unit is further programmed to conduct a comparative test of at least one restrictive covenant of said data usage agreement against a prior usage history of the stored data.

19. The data rendering system according to claim 12 wherein said logic unit is further programmed to conduct a comparative test of at least one restrictive covenant of said data usage agreement against at least one time dependent parameter.

20. The data rendering system according to claim 12 wherein said memory cell comprises a removable modular component.

21. The data rendering system according to claim 12, wherein said alteration detector comprises:

a light source; and an optical detector mounted in vicinity of said light source, the optical detector responsive to light emitted by said light source.

22. The data rendering system according to claim 12, wherein said alteration detector comprises:

an electric power supply;

a contact circuit breaker electrically connected to said power supply, wherein an electrical conductivity of said circuit breaker is dependent on an existence of mechanical contact of the contact circuit breaker with said data storage medium; and an alteration signal generator electrically connected to said power supply wherein said contact circuit breaker is configured to generate a signal dependent on an electrical voltage applied to said signal generator.

23. The data rendering system according to claim 12 wherein said data reader comprises a reader configured to access an optically readable media.

24. The data rendering system according to claim 12 wherein said external influence comprises a mechanical force.

25. The data rendering system according to claim 12 further comprising a parameter generator configured to generate at least one parameter to be tested against at least one restrictive covenant of the data usage agreement.

26. The data rendering system according to claim 25 wherein said parameter generator comprises a device generating a time-dependent signal.

27. The data rendering system according to claim 25 wherein said parameter generator comprises a device generating a signal uniquely identifying said data rendering system.

28. A method to distribute content stored on a removable data storage medium enabled for controlled and verifiable alteration by an external influence in a manner detectable by a data rendering system, said method comprising:

delivering a medium storing content associated with access data to the data rendering system;

storing at least part of the access data in said system;

altering said medium to render at least part of the access data unreadable, wherein at least a portion of the content is inaccessible before said alteration;

testing said medium for said alteration; and retrieving at least part of the content from said medium using the access data stored in said system.

29. The method to deliver content according to claim 28 wherein at least part of said content is encrypted, and the access data comprises an encryption key essential for decrypting said content.

30. The method to deliver content according to claim 28 wherein at least part of the content comprises data selected from audio data, video data, video game, computer software, and graphical data.

31. The method to deliver content according to claim 28 wherein said medium comprises an optically readable medium.

32. The method to deliver content according to claim 28 wherein said external influence comprises a mechanical force.

33. The method to deliver content according to claim 28 wherein said altering is conducted by an end user.

34. The method to deliver content according to claim 28 wherein said altering is conducted by the data rendering system.

35. The method to deliver content according to claim 28 further comprising;

recording usage history of said content;

conducting a comparison test of said usage history against at least one restrictive covenant of the content usage agreement.

36. The method to deliver content according to claim 28 further comprising retrieving at least one restrictive covenant of the content usage agreement from the data stroge medium containing said content.

37. The method to deliver content according to claim 36 further comprising;

conducting a comparative test of the retrieved restrictive covenant of the content usage agreement against at least one parameter generated by said data rendering system.

38. The method to deliver content according to claim 37 wherein said parameter comprises a time dependent parameter.

39. An optically readable data storage medium comprising at least one structural weakness for irreversible alteration by an external mechanical force in a manner detectable by a designated data rendering system, said alteration permanently corrupting at least part of data stored in the medium with a purpose of enforcing a data usage agreement wherein at least part of the stored data is not accessible by the designated data rendering system until the alteration is detected.

40. A data storage medium comprising:
a main data storage area configured to store main data; and
an alterable structure separate from the main data storage area and configured to store access data separate from the main data that is used to access the main data, wherein alteration of the alterable structure renders the access data inaccessible and the main data accessible.

41. The data storage medium of claim 40, wherein the alterable structure is located centrally to the main data storage area.

42. The data storage medium of claim 40, wherein the alterable structure is located at the periphery of the data storage area.

* * * * *